(12) United States Patent
Kim

(10) Patent No.: US 8,383,946 B2
(45) Date of Patent: Feb. 26, 2013

(54) HEAT SINK

(75) Inventor: Sun-Ki Kim, Gunpo-si (KR)

(73) Assignee: Joinset, Co., Ltd. (KR)

( * ) Notice: Subject to any disclaimer, the term of this patent is extended or adjusted under 35 U.S.C. 154(b) by 386 days.

(21) Appl. No.: 12/782,267

(22) Filed: May 18, 2010

(65) Prior Publication Data

US 2011/0284271 A1　Nov. 24, 2011

(51) Int. Cl.
*H05K 7/20* (2006.01)

(52) U.S. Cl. ........ 174/252; 174/255; 174/260; 174/263; 361/719; 361/720; 165/80.3; 165/185

(58) Field of Classification Search ............ 361/679.46, 361/679.47, 679.54, 700–712, 714–724, 361/760–767, 816, 818; 174/16.3, 252; 257/706–727; 165/80.3, 104.33, 185
See application file for complete search history.

(56) References Cited

U.S. PATENT DOCUMENTS

| | | | | |
|---|---|---|---|---|
| 5,050,038 | A * | 9/1991 | Malaurie et al. | 361/720 |
| 5,164,884 | A * | 11/1992 | Pesola | 361/717 |
| 5,214,309 | A * | 5/1993 | Saarnimo | 257/712 |
| 6,008,987 | A * | 12/1999 | Gale et al. | 361/700 |
| 6,621,705 | B1 * | 9/2003 | Ballenger et al. | 361/719 |
| 7,521,791 | B2 * | 4/2009 | Wodrich et al. | 257/706 |
| 7,663,891 | B2 * | 2/2010 | Tanaka et al. | 361/760 |
| 2011/0155360 | A1 * | 6/2011 | Liu | 165/185 |

FOREIGN PATENT DOCUMENTS

| | | |
|---|---|---|
| DE | 004231828 A1 * | 3/1994 |
| DE | 004332115 A1 * | 3/1995 |
| JP | 2006-100752 | 4/2006 |
| TW | 200847857 A * | 12/2008 |

* cited by examiner

*Primary Examiner* — Michail V Datskovskiy

(74) *Attorney, Agent, or Firm* — Locke Lord LLP; Alan B. Clement; Peter J. Fallon

(57) ABSTRACT

A heat sink capable of being surface-mounted, the heat sink having a 3D shape and comprising a body made of metal, having a rear side which is horizontal and a front side which is at least partially horizontal, such that the front side is partially surface-mounted on a conductive pattern of a printed circuit board (PCB) by pick-and-place and the rear side is attached to the conductive pattern by reflow-soldering.

21 Claims, 8 Drawing Sheets

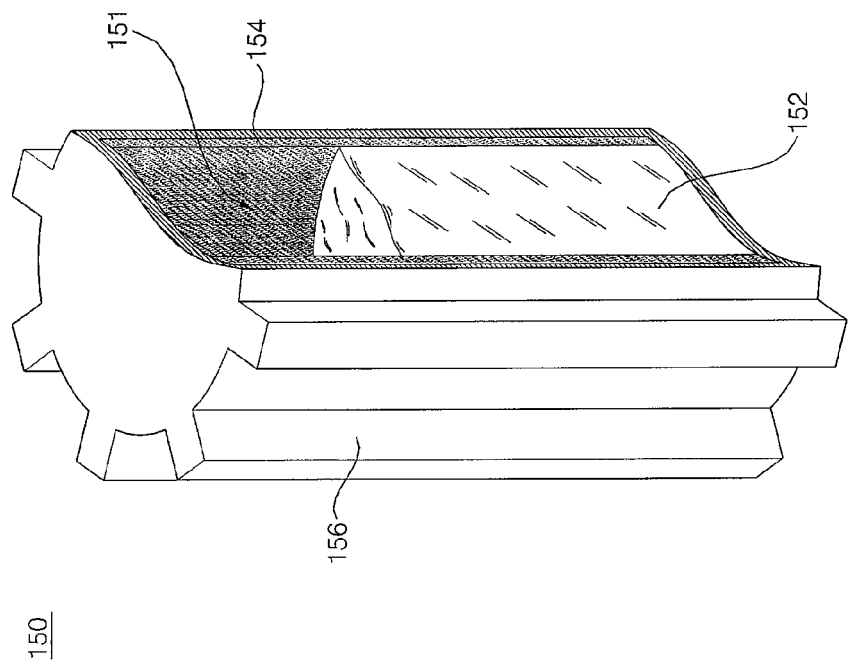

1

HEAT SINK

BACKGROUND ART

1. Field of the Invention

The present invention relates to a heat sink, and more particularly, to a heat sink, a front side of which is picked and placed and surface-mounted and a rear side of which is reflow-soldered to a conductive pattern of a printed circuit board (PCB) by a solder paste.

In addition, the present invention relates to a small-sized heat sink capable of more efficiently diffusing and cooling heat generated from a heating element through a conductive pattern of a PCB disposed adjacent to the heating element, and also capable of being conveniently mounted on the conductive pattern at low costs.

2. Description of the Related Art

Recently, portable electronic communication devices such as a mobile phone have been reduced in size and weight while having increased in data processing speed and capacity. Accordingly, much heat is generated from a semiconductor chip that supplies main functions of the devices, which deteriorates the performances, for example a radio frequency (RF) performance of the semiconductor chip.

Also, a semiconductor chip such as a light emitting diode (LED) effecting high brightness generates much heat and the heat shortens the lifespan of the LED chip.

In general, a metal heat pipe having a high thermal conductivity, a heat sink, a polymer thermal pad and the like are used to effectively cool heat of a heating element or a heating module of a semiconductor, such as a field effect transistor (FET) mounted on a conductive pattern of a printed circuit board (PCB).

Additionally, for efficient cooling of heat, thermally conductive ceramic or metal may be used for the material of a PCB in a light emitting diode (LED) lighting device which generates much heat. In this case, a part performing cooling in the ceramic or metal circuit board requires a uniform thickness, a complicated process, and a high cost. For example, if the whole circuit board is made of a high-thermal-conductivity material for cooling of the heating element, an expensive material is used even for a part insusceptible to heat, accordingly increasing the material cost.

General heat sinks are manufactured by processing a high thermal-conductive metal such as Al with various methods including die-casting, powder injection molding (PIM), and casting, and mounting the processed metal on a heating element. Therefore, heat of a heating part is transferred to the heat sink and radiated and diffused to the air through the heat sink. To this end, an exemplary heat sink has a wide area for contact with the heating element, a wide outer surface for contact with air, a high thermal conductivity, and a high thermal diffusion efficiency.

For this purpose, according to a related art, a heat sink made of metal such as Al is formed to have predetermined volume and shape having a horizontal rear side and a wide-area front side for contact with air. The metal heat sink is attached on a heating element mounted on a PCB using an adhesive made of any one of thermally conductive elastic rubber, a pad, and an adhesive tape.

However, when the heat sink is mounted using such elastic adhesive, pad, or adhesive tape, an adhesion strength and a thermal conductivity are reduced compared to the case of using a soldering method. Also, according to the related art, mounting of the heat sink is hard to automate and therefore is manually performed. Accordingly, the mounting cost is increased while reliability of the product and convenience of rework are reduced.

In other words, it is difficult to apply a pick-and-place method and a surface mounting technology (SMT) by reflow soldering with a solder paste to the heat sink.

Furthermore, the related-art heat sink is large and heavy. Especially in a personal terminal device such as a mobile phone and a personal digital assistant (PDA) restricted in size and weight, the large and heavy heat sink is limited to be applied.

Especially, in a small device such as the personal terminal device, it is difficult to secure height for mounting the heat sink on a heating element.

In addition, when an insulation coating process to prevent corrosion, such as anodizing, is performed with respect to the heat sink made of Al, the thermal conductivity is reduced.

In addition, the mounting position of the related-art heat sink is usually limited to a position on the heating element.

Also, being mounted on the heating element, the related-art heat sink merely radiates and diffuses heat but is not expected to increase an electrical ground area on the conductive pattern in the PCB.

Furthermore, the related-art heat sink is incapable of cooling a specific electrical contact terminal which is especially susceptible to heat, more than a plurality of other electrical contact terminals mounted on the heating element. Furthermore, the related-art heat sink costs a lot.

Meanwhile, in the case where the heating element is a semiconductor part constituted by a bare chip, a lead frame which connects the bare chip to an electrical circuit of a PCB, and an epoxy molding compound (EMC) which protects the bare chip and the lead frame, the EMC having a low thermal conductivity is ineffective to radiate and diffuse heat of the bare chip to the outside through a heat sink mounted thereon.

Heat of the heating element can be efficiently removed by increasing the volume of a heat sink, using a high-thermal-conductivity material, and improving the structure of a heat sink or a heat pipe and the adhesion method. However, the related-art technology is insufficient to effectively remove heat of a heating element equipped in a relatively small terminal device.

SUMMARY OF THE INVENTION

An object of the present invention is to provide a heat sink capable of efficiently removing heat generated from a heating element mounted on a printed circuit board (PCB) at a position adjacent to the heating element.

Another object of the present invention is to provide a heat sink capable of being easily mounted on a conductive pattern of a PCB on which a heating element is mounted.

A further another object of the present invention is to provide a heat sink capable of being surface-mounted by pick-and-place and reflow-soldered by a solder paste, that is, the heat sink enabling application of an economical and reliable SMT thereto.

Even another object of the present invention is to provide a heat sink capable of being reworked conveniently.

A still another object of the present invention is to provide a heat sink having excellent thermal conductivity, thermal diffusion and radiation efficiency, and adhesion strength.

A yet another object of the present invention is to provide a heat sink capable of increasing an electrical ground area.

Yet still another object of the present invention is to provide a heat sink being small, lightweight, and inexpensive.

Yet still another object of the present invention is to provide a heat sink capable of cooling a heating element without increasing height of the heating element.

Yet still another object of the present invention is to provide a heat sink capable of further cooling a metal terminal especially susceptible to heat by a special degree in comparison with a plurality of other metal terminals mounted on a heating element.

According to an aspect of the present invention, there is provided a heat sink including a three-dimensional (3D) body which includes a horizontal rear side at least a part of which includes a metal layer and a front side at least a part of which is horizontal, wherein the heat sink is configured to be picked up by applying a vacuum to the part of the front side and be surface-mounted on a solder paste disposed on a conductive pattern of a printed circuit board (PCB) on which a heating element is mounted, and the metal layer of the rear side is configured to be reflow-soldered to the solder paste formed on the conductive pattern.

The body may include any one of a metal, a thermally conductive ceramic, and a carbon-containing material.

The metal may include any one of Mg, Al, and Cu or an alloy thereof, the thermally conductive ceramic may include any one of $Al_2O_3$ and MN, and the carbon-containing material may include graphite.

An outermost layer of the metal layer may include a material to which reflow soldering is applicable.

The body may include at least one uneven surface or rib formed on a lateral side thereof.

The body may include at least one recess or through hole. An auxiliary cooling unit may be removably mounted to the recess or the through hole, the auxiliary cooling unit including a cooling fin constituted by a metal shaft or pipe and a plurality of thin metal plates mounted to the shaft or pipe.

The body may include a sealed space charged with a heat transfer medium, and a wick is installed or a plurality of grooves may be formed along an inner side wall of the sealed space.

The conductive pattern may be provided in singular or in plural adjacent to the heating element mounted on the PCB. The conductive pattern may include any one of a circuit pattern, a ground pattern, and a dummy pattern disposed adjacent to the heating element mounted on the PCB.

The conductive pattern may be provided in singular or in plural on at least one of a front side and a rear side of the PCB.

The conductive pattern may include a ground pattern disposed adjacent to the heating element mounted on the PCB, and an electrical ground area may be increased by the heat sink.

The conductive pattern disposed on one side of the PCB, on which the heating element is mounted, may be connected with a conductive pattern disposed on the other side of the PCB through via hole.

The PCB may include any one selected from a polymer substrate, a film substrate, a ceramic substrate, and a metal substrate.

The heat sink may further include another thermally conductive material disposed on a part of the body except the rear side. The part of the body except the rear side may be brought into contact with the heating element.

The part of the body except the rear side may be brought into contact with a metal can enclosing the heating element.

The heat sink may have a smaller height than the heating element.

BRIEF DESCRIPTION OF THE DRAWINGS

The above objects and other advantages of the present invention will become more apparent by describing in detail preferred embodiments thereof with reference to the attached drawings in which:

FIG. 8 is a view showing a heat sink according to another embodiment of the present invention.

DETAILED DESCRIPTION OF THE PREFERRED EMBODIMENT

Now, preferred embodiments of the present invention will be described in detail with reference to the accompanying drawings.

Figure 1A:
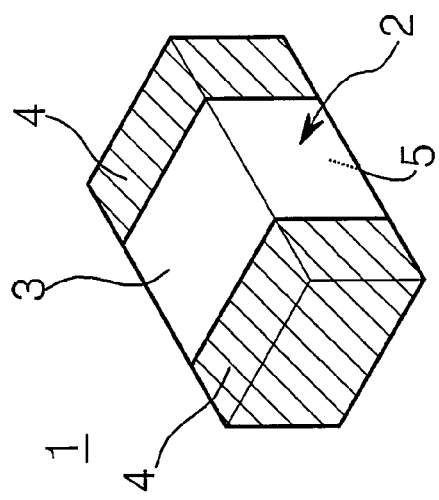
FIGS. 1A, 1B, and 1C are perspective views respectively showing different types of a heat sink according to an embodiment of the present invention.
Figure 1B:
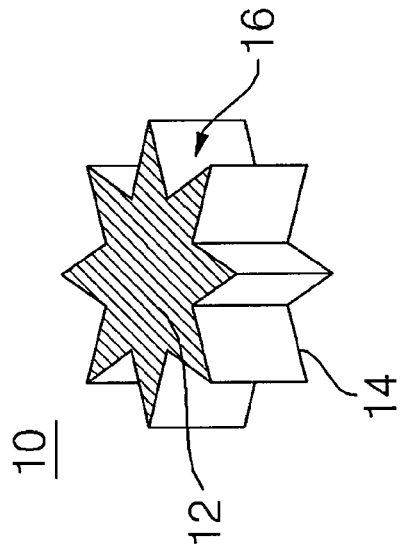
Figure 1C:
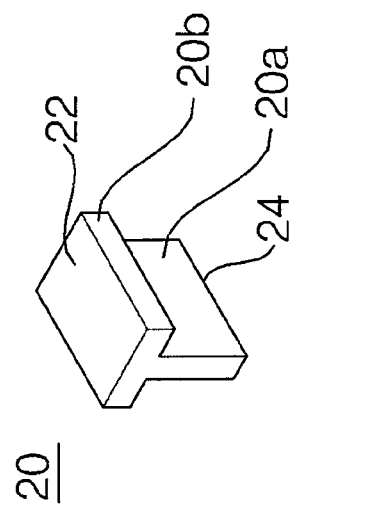

FIGS. 1A, 1B, and 1C are perspective views respectively showing different heat sinks 1, 10, and 20 according to an embodiment of the present invention.

As shown in FIG. 1A, the heat sink 1 has a three-dimensional (3D) rectangular shape. The heat sink 1 includes a front side 3 and a rear side 5 which are horizontal, and a body 2 made of a thermally conductive ceramic or a carbon-containing material. The front and rear sides 3 and 5 enclose both sides of the body 2 to enable application of reflow-soldering to a solder paste. However, not limited to the above structure, a metal layer 4 may be formed only at the rear side of the body 2. The heat sink 1 may be reflow-soldered to a solder paste through the metal layer 4 formed at least on the rear side.

The heat sink 1 according to the present embodiment is convenient to manufacture and to apply pick-and-place and tape-and-reel package.

Exemplarily, the thermally conductive ceramic material may be any one of $Al_2O_3$ and AlN having a high thermal conductivity, but not limited thereto. More exemplarily, AlN having a higher thermal conductivity may be applied.

Exemplarily, the carbon-containing material may be any one of graphite and carbon having a high thermal conductivity. More exemplarily, graphite more efficiently diffusing heat in horizontal directions may be applied although not limited thereto.

Each of the heat sinks 10 and 20 of FIGS. 1B and 1C, respectively, includes an integrated metal body having a 3D shape. Front sides 12 and 22 and rear sides 14 and 24 of the heat sinks 10 and 20 are horizontal surfaces.

As shown in FIG. 1B, the heat sink 10 may include a plurality of uneven surfaces 16 formed on a lateral side thereof, thereby having a star-shape cross section. However, the heat sink 10 may be in other various forms. For example, a plurality of ribs may be protruded along the lateral side of the heat sink 10 so that a surface area is increased and heat radiation and diffusion are efficiently performed.

Referring to FIG. 1C, the heat sink 20 has a lower body 20a having a smaller surface area than an upper body 20b. In this case, as will be explained hereinafter, heat radiation and diffusion efficiency may be improved since surface areas of the front side 22 and a lateral side are increased although the heat sink 20 occupies a small area of a conductive pattern on a printed circuit board (PCB) on which other various parts are compactly mounted. With the same principle, height of the lower body 20a of the heat sink 20 may be increased so that the heat radiation and diffusion efficiency is improved while a contact area between the lower body 20a and other parts compactly mounted on the PCB is minimized. However, in this case, solder strength and heat transfer from the conductive pattern may be reduced.

According to an exemplary embodiment, the metal constituting the heat sinks 10 and 20 may include any one selected from the group containing Mg, Cu, and Al or an alloy thereof. Especially, Cu is recommended in consideration of high thermal conductivity and reflow soldering efficiency. Although Mg and Al are lightweight, they require a complicated surface process and are inconvenient to perform reflow soldering.

Surfaces of the front sides 12 and 22 of the heat sinks 10 and 20 or the metal layer 4 may be plated with any one of Sn, Ni, and Ag to prevent oxidation thereof and facilitate reflow soldering.

Figure 2:
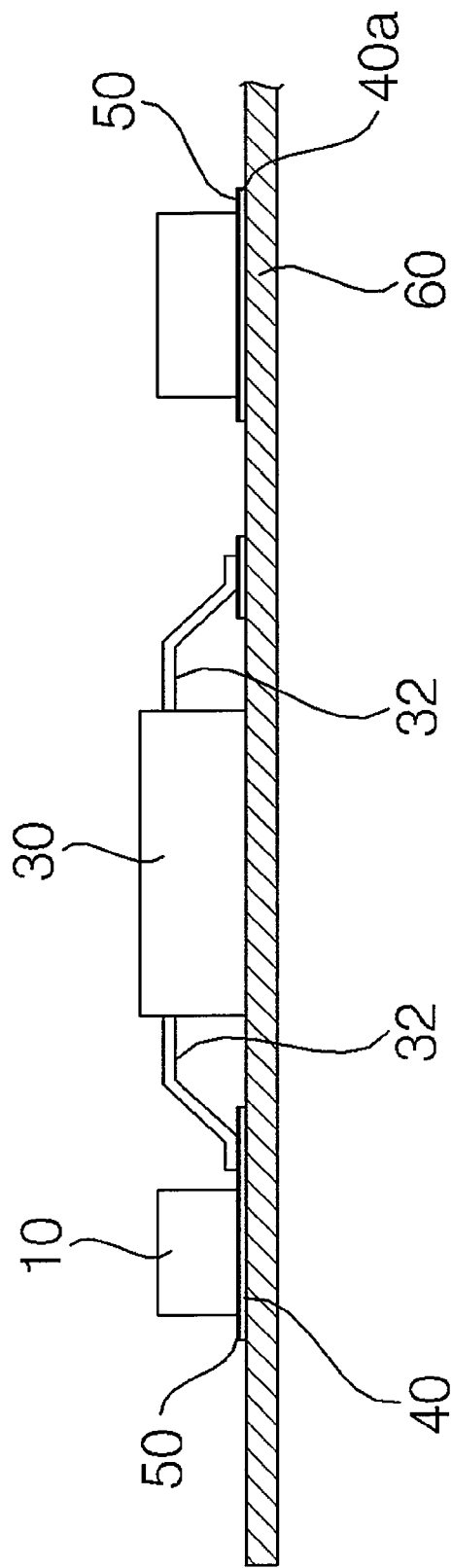
FIG. 2 shows a state where the heat sink of FIG. 1A is practically applied.

According to an exemplary embodiment, the heat sinks 1, 10, and 20 have a width of about 0.5 to 10 mm, a length of about 1 to 10 mm, and a height of about 1 to 3 mm. More exemplarily, the heat sinks 1, 10, and 20 may have a width of about 0.5 to 2 mm, a length of about 1 to 3 mm, and a height of about 0.3 to 1 mm. Also, it is exemplary that the height of the heat sinks 1, 10 and 20 are less than a height of the heating element 30 (FIG. 2).

Hereinafter, a manufacturing method of the heat sink according to the embodiment of the present invention will be briefly explained. The heat sink 10 of FIG. 1B will be taken as an example for a convenient explanation.

Cu is continuously extruded through a mould die having a star-shape cross section, into a Cu shaft having an outer diameter of about 1 mm and the star-shape cross section. Here, as large area as possible of an outer circumferential side of the Cu shaft is exposed to the outside.

Next, the continuously extruded Cu shaft is cut by a cutter into about 2 mm lengths such that cut surfaces are horizontal.

Ni undercoat is applied on the cut Cu shaft. Sn electroplating is applied to the outermost surface of the Cu shaft to a thickness of about 0.003 mm Therefore, reflow soldering may be conveniently performed while corrosion is prevented.

Thus-manufactured heat sink 10 has the outer diameter of about 1 mm, the height of about 2 mm, and the front side 14 and the rear side 12 forming horizontal surfaces. The outer circumferential side of the heat sink 10 has the uneven surfaces 16 such that the cross section forms a star shape. Since the rear side 14 is horizontal, reflow soldering may be conveniently applied to the rear side 14. Also, since the reflow soldering is applied to a large area, solder strength and thermal conductivity are increased. The front side 12 being also horizontal enables surface-mounting thereof by pick-and-place. In addition, the uneven surfaces 16 formed on the outer circumferential side increases a contact area with the air, thereby enhancing the heat radiation and diffusion efficiency.

Furthermore, the Sn plating not only facilitates the reflow-soldering to the solder paste but also protects the heat sink 10 from oxidation by environmental changes.

The heat sink 10 is not easily moved by air supplied during the reflow soldering due to its own weight. Thus, the reflow soldering is performed conveniently.

As the rear side 14 has a smaller width, a surface-mounting area on the PCB is less occupied. On the other hand, as the outer circumferential side and the front side 12 have a larger area, the heat radiation and diffusion efficiency is improved.

Next, the heat sink 10 plated with Sn or Ag is reel-taped by pick and place to apply the SMT.

The reel-taped heat sink 10 is surface-mounted by pick-and-place on the solder paste applied on the conductive pattern adjacent to the heating element on the PCB, and then reflow-soldered to the solder paste formed on the conductive pattern using a reflow soldering machine.

The heat sink 10 reflow-soldered to the conductive pattern adjacent to the heating element on the PCB through above processes absorbs heat generated from the heating element and radiates the heat to the air or cools the heat.

According to the embodiment of the present invention, the small-size heat sink 10 is soldered to the conductive pattern adjacent to the heating element to radiate and diffuse heat of the heating element. Especially, if necessary, one or more heat sinks 10 may be provided on one or more conductive patterns so that the heat radiation and diffusion efficiency for the heating element is maximized.

The conductive pattern disposed adjacent to the heating element may be provided on at least one of the front side and the rear side of the PCB surface.

Although the extruded Cu shaft is used for the heat sink 10 in this embodiment, the present invention is not limited thereto. For example, the heat sinks 10 and 20 may be manufactured by die-casting or powder-pressing metal, which facilitates mass production.

Also, as shown in FIG. 1A, the heat sink 1 may be manufactured by processes and materials used for a ceramic chip part of a general surface mounting device (SMD) to which the SMT is applicable.

For example, the ceramic body 2 of the heat sink 1, which includes a ceramic substrate having a high thermal conductivity, cannot be soldered to the solder paste. To this end, the metal layer 4 is provided to the rear side of the ceramic body 2 for convenient soldering to the solder paste and the soldering. The metal layer 4 may be manufactured by processes and materials generally used for an external electrode of an SMD ceramic chip part.

Exemplarily, the metal layer 4 may be formed on the overall rear side of the ceramic body 2 to enhance thermal contact with the conductive pattern. More exemplarily, the metal layer 4 may be manufactured by forming a Cu or Ag paste on the body 2 including the rear side by a thermal treatment and then applying Sn plating thereto.

Exemplarily, the ceramic body 2 may be made of any one of $Al_2O_3$ and AlN. More exemplarily, the ceramic body 2 may have a multilayer structure such that internal metal electrodes are formed inside the ceramic body 2. In this case, the thermal conductivity and diffusion efficiency may be further improved.

Instead of the thermally conductive ceramic substrate, a graphite or carbon substrate having a high thermal conductivity and elasticity may be used for the body 2 of the heat sink 1. In this case, the weight is reduced and the thermal conductivity and diffusion efficiency are improved compared to the case of using ceramic. However, on the other hand, the manufacturing cost is increased and it becomes difficult to form the metal layer 4 for the reflow soldering at the rear side.

FIG. 2 shows a state where the heat sink 10 according to the embodiment of the present invention is practically applied.

A heating element 30, for example, a semiconductor chip having a metal lead frame 32, and the heat sink 10 are mounted on conductive patterns 40 and 40a of a PCB 60 by reflow soldering using a solder 50. According to an exemplary embodiment, the solder 50 may be a solder paste.

Here, the PCB 60 may be any one of a polymer substrate, a film substrate, a ceramic substrate, and a metal substrate.

In this case, heat generated from the heating element 30 is radiated and diffused by being transferred to the lead frame 32, the solder 50, the conductive patterns 40 and 40a, the heat sink 10, and then to the air sequentially, that is, in the order of high to low thermal conductivity. Here, the conductive patterns 40 and 40a may be at least one of a circuit pattern, a ground pattern, and a dummy pattern for supply of power or signals.

For example, the conductive pattern 40 may be any one of the ground pattern and the circuit pattern. The conductive pattern 40a may be the dummy pattern.

However, in consideration of use of the PCB 60, a mounting position of the heat sink 10 is most appropriate when the conductive pattern 40 is the ground pattern.

During this, although the heat generated from the heating element 30 is transferred to an insulating substrate of the PCB 60, having a low thermal conductivity, the heat is transferred also to the heat sink 10 having a high thermal conductivity and then cooled in the air. Thus, according to the above-described heat transfer path, the heat generated from the heating element 30 may be rapidly transferred to the heat sink 10 having a large-area outer circumferential side for contact with the air. As a result, the heat radiation efficiency and the cooling efficiency are enhanced.

The heat generated from the heating element 30 is radiated and diffused even through an epoxy molding compound (EMC) having a low thermal conductivity.

Therefore, although not shown, a related-art metal heat sink may be attached to the heating element 30 by conventional methods so as to increase the heat radiation and diffusion efficiency. In this case as well, the cooling efficiency for the heating element 30 is also improved by the heat sink 10.

Exemplarily, the rear side of the heat sink 10 is formed smaller than the outer circumferential side or the front side of the heat sink 10 so as to occupy a minimum mounting area on the PCB 60 while the heat radiation and diffusion efficiency is enhanced.

Moreover, in the case where the heat sink 10 is mounted on the lead frame 32 disposed on the conductive pattern 40, heat of the heating element 30 may be more quickly transferred to the heat sink 10. Since the conductive pattern 40 is used as a ground pattern in this case, the total electrical ground area on the PCB 60 is increased. As a result, radio frequency (RF) characteristics of RF components mounted on the PCB 60 are improved.

Also, in the case where the conductive pattern 40 is an electrical circuit pattern, the electrical circuit is not influenced by the heat sink 10 since the front side and the outer circumferential side of the heat sink 10 are exposed to the air and electrically insulated.

The conductive pattern 40 may includes a plurality of dummy patterns 40a in the form of islands electrically insulated from the electrical circuit. When the heat sink 10 is soldered on the dummy patterns 40a, the heat radiation and diffusion efficiency may be enhanced. In this case, the circuit pattern and the ground pattern may be used for other functions. However, the cooling efficiency for the heating element 30 is reduced.

Furthermore, although not shown, if reflow soldering using the solder 50 is applicable to a surface of the heating element 30, the heat sink 10 may be surface-mounted and reflow-soldered directly on the heating element 30. In this case, the heat transfer and diffusion efficiency is improved. However, the mounting process is complicated and the whole thickness increases. Additionally, in case that the heating element 30 is a light emitting diode (LED), a shadow may be caused.

For another example, the heat sink 10 may be surface-mounted directly on the lead frame 32 of the heating element 30. Although the heat transfer and diffusion efficiency is further enhanced, the surface mounting becomes difficult due to a shape of the lead frame 32.

Therefore, a metal terminal which most needs cooling may be selected among metal terminals of the lead frame having a plurality of electrical terminals, and the heat sinks 10 may be mounted intensively around the selected metal terminal. According to this method, the cooling function is focused only on a necessary part, consequently reducing the manufacturing cost and the material cost.

More specifically, in the related-art structure, a highly thermal conductive PCB such as the metal substrate is applied throughout to cool the heating element, accordingly increasing the cost. On the other hand, according to the embodiment of the present invention, the heat sinks 10 are selectively and intensively mounted where cooling of the PCB is required. Therefore, the cooling efficiency may be increased with less manufacturing cost.

In addition, although not shown, in the case where the heating element 30 instead of the lead frame 32 is mounted to the conductive pattern 40 of the PCB 60 by solder balls, the heat sink 10 may be reflow-soldered on the conductive pattern 40 adjacent to the heating element 30 by the solder 50.

In an exemplary embodiment, one or more conductive patterns 40 are formed adjacent to the heating element 30 and one or more heat sinks 10 are mounted on each conductive pattern 40. Here, the cooling function for the heating element 30 may be controlled by adjusting the number of the conductive patterns 40 and the heat sinks 10.

As described above, when a plurality of the heat sinks 10 being inexpensive and lower than the heating element 30 are mounted intensively around the heating element 30 by reflow soldering, the overall cooling efficiency for the heating element 30 may be improved. Also, the manufacturing cost, the adhesion strength, and the rework efficiency are improved.

Figure 3:
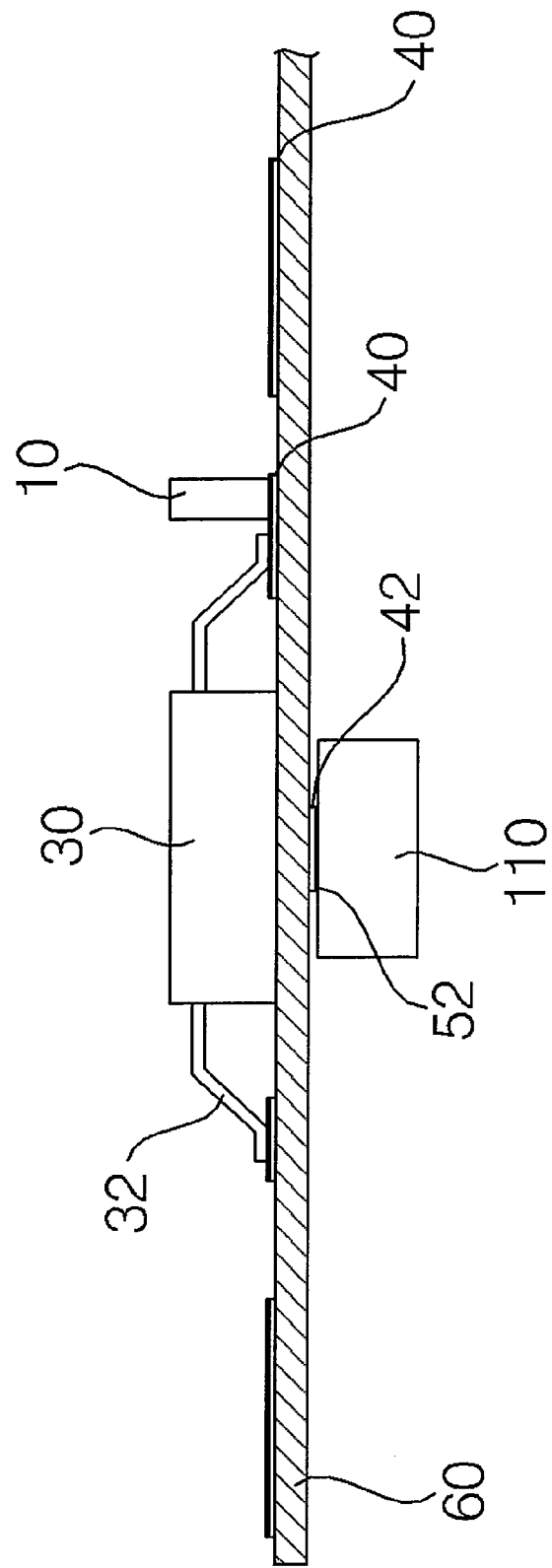
FIG. 3 shows another state where the heat sink of FIG. 1A is practically applied.

FIG. 3 shows another state where the heat sink according to the embodiment of the present invention is practically applied.

Referring to FIG. 3, the heating element 30 is soldered on a front side of the PCB 60 but is not mounted on a rear side of the PCB 60. However, a dummy pattern 42 as a conductive pattern is disposed on the rear side of the PCB 60 at a position corresponding to the heating element 30. Next, a solder 52 is disposed on the dummy pattern 42 so as to mount a heat sink 110 by reflow soldering.

Not limited to the above structure, although not shown, a ground pattern instead of the dummy pattern 42 may be formed as a conductive pattern on the rear side so that the heat sink 110 is reflow-soldered by a solder disposed on the ground pattern.

In this case, the heat generated from the heating element 30 is transferred and radiated sequentially to the lead frame 32, the solder 50, the conductive pattern 40, the heat sink 10, and then to the air in the order of high to low thermal conductivity, thereby being cooled. The heat generated from the heating element 30 and transferred to the PCB 60 having a low thermal conductivity is transferred and radiated sequentially to the dummy pattern 42, the solder 52, the heat sink 110 and to the air, and then cooled. Thus, cooling speed and performance for the heating element 30 are improved by the heat sink 110 soldered on the rear side of the PCB 60.

In addition, since the heat sink 110 is mounted on the rear side, the mounting area on the PCB 60 mounting the heating element 30 thereon may be minimized by the heat sink 110.

In case that the heating element 30 is an LED, illuminance of the LED may not be reduced.

As described above, the small-size heat sinks 10 and 110 are conveniently mounted adjacent to the heating element 30 and improve the heat radiation and diffusion efficiency of the heating element 30.

According to an exemplary embodiment, pluralities of the heat sinks 10 and 110 may be provided on a plurality of conductive patterns.

In an exemplary embodiment, the heat sinks 10 and 110 may be soldered using a solder paste to at least one of the front side and the rear side of the PCB.

Figure 4:
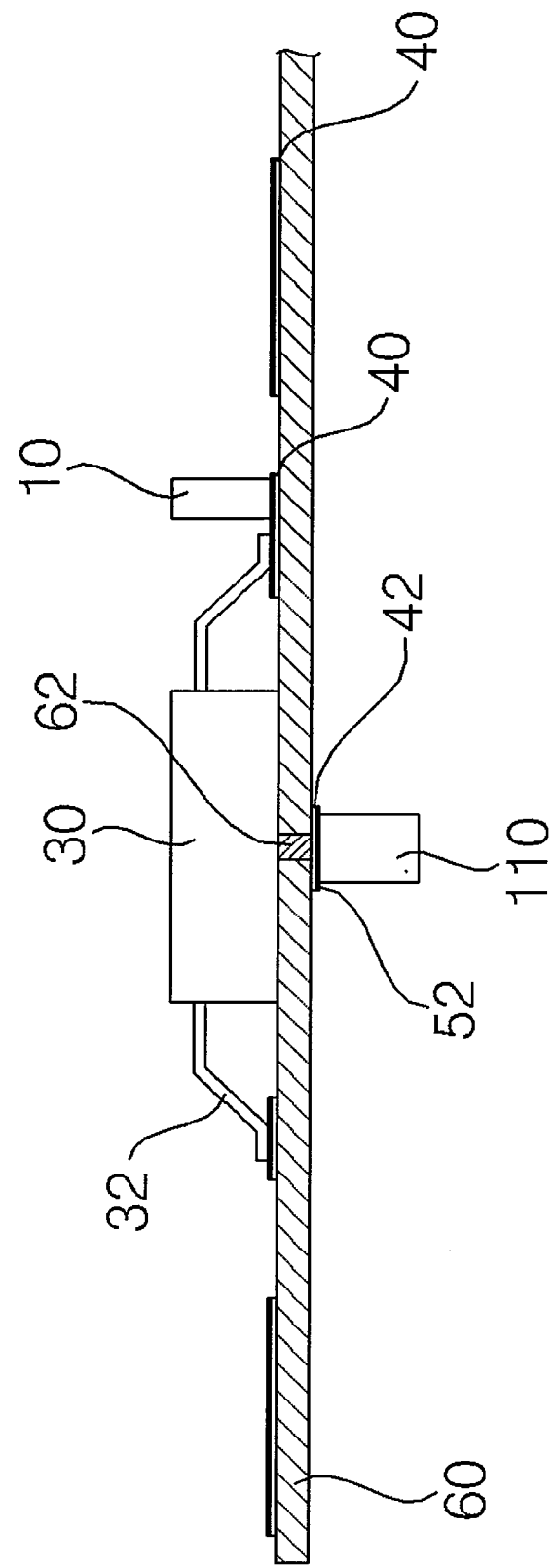
FIG. 4 shows yet another state where the heat sink of FIG. 1A is practically applied.

FIG. 4 shows another state where the heat sink 10 is practically applied.

Differently from in FIG. 3, FIG. 4 shows that a via hole 62 having a high thermal conductivity is formed through the PCB 60 at a position corresponding to the heating element 30. An inside of the via hole 62 is charged with metal having a high thermal conductivity. Alternatively, a metal layer may be formed on an inner wall of the via hole 62 to be in thermal contact with the heating element 30 and the dummy pattern 42.

According to the above structure, heat radiated from the heating element 30 is transferred to the dummy pattern 42 through the via hole 62 and more quickly radiated to the air through the solder 52 and the heat sink 110.

The via hole 62 may be manufactured through processes generally applied in the field of the PCB. Exemplarily, one or more via hales 62 may be provided to transfer heat quickly.

Exemplarily, the front sides of the heat sinks 10 and 110 are surface-mounted by pick-and-place and the rear sides are reflow-soldered by a solder paste.

Figure 5:
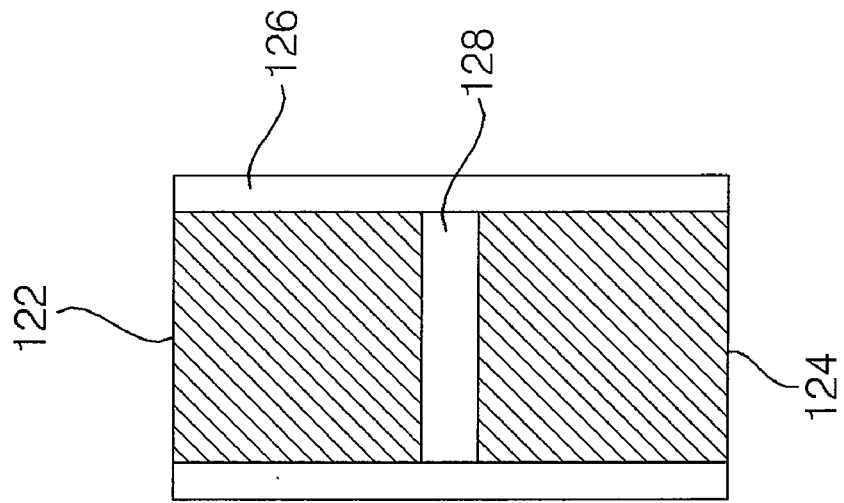
FIGS. 5A and 5B are respectively a perspective view and a sectional view showing a heat sink according to another embodiment of the present invention.
Figure 5:
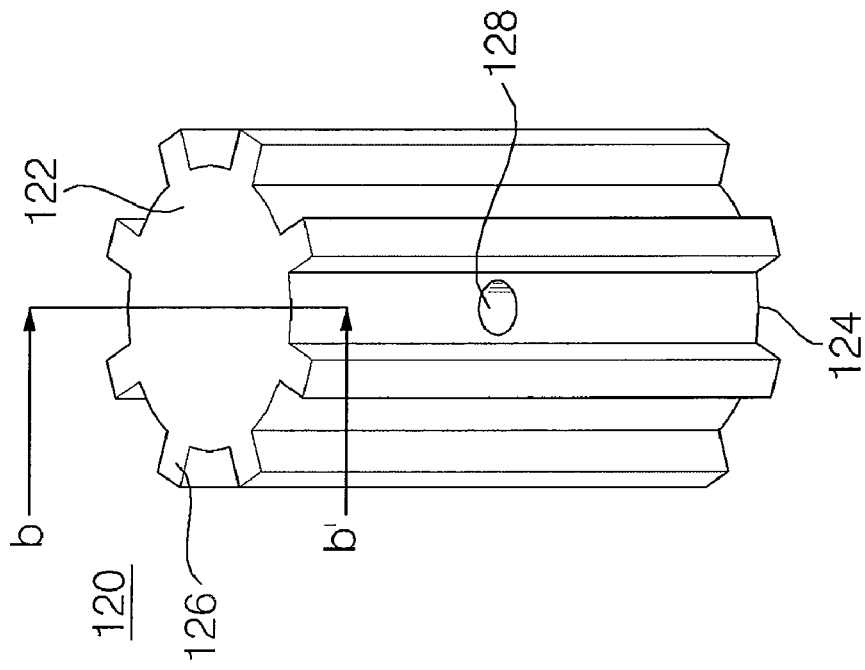

FIG. 5 shows a heat sink 120 according to another embodiment of the present invention.

Referring to FIG. 5, a front side 122 and a rear side 124 of the heat sink 120 are horizontally formed and a plurality of ribs 126 are arranged on an outer circumferential side of the heat sink 120 so that a heat radiation area is increased. Additionally, a through hole 128 is formed through the heat sink 120 in a horizontal direction.

The through hole 128 is only an example of various types of holes. That is, a non-penetrating recess may be formed instead of the through hole 128. The through hole 128 may be provided in a plural number. In addition, the through hole 128 may penetrate the heat sink 120 not only horizontally but also vertically.

According to the above structure, a surface area for radiation and diffusion of heat may be increased by the existence of the ribs 126. The surface area of the heat sink 120 is also increased by the through hole 128. As the air flows through the through hole 128, the heat radiation and diffusion efficiency of the heat sink 120 is improved.

Exemplarily, the front side 122 of the heat sink 120 is surface-mounted by pick-and-place and the rear side 124 is reflow-soldered by a solder paste.

Figure 6:
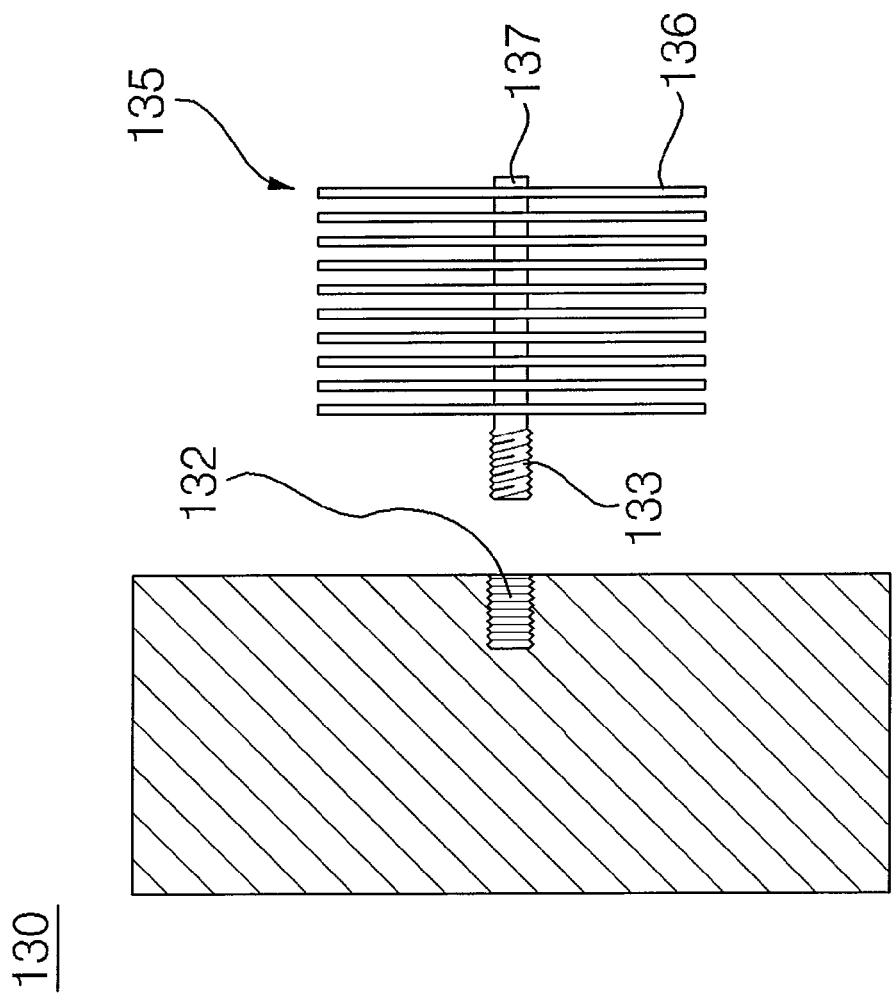
FIG. 6 is a view showing a heat sink according to another embodiment of the present invention.

FIG. 6 shows a heat sink 130 according to another embodiment of the present invention.

The heat sink 130 according to the present embodiment includes a screw recess 132 formed on an outer circumferential side thereof. A cooling fin 135 is screw-connected with the screw recess 132. The cooling fin 135 may be constituted by a shaft 137 in the form of a bar or a tube having a screw part 133 at one end, and a plurality of thin metal plates 136 fixed on the shaft 137 at uniform intervals.

With this structure, a cooling efficiency of the heat sink 130 may be enhanced by the cooling fin 135 including the plurality of thin metal plates 136. Accordingly, the heat generated from the heating element is transferred sequentially to the conductive pattern, the solder, and the heat sink which have higher thermal conductivity than the EMC. Thus, the cooling efficiency of the heating element is improved.

Here, the cooling fin 135 may be mounted before or after mounting of the heat sink 130 to the PCB as necessary. The cooling fin 135 may be mounted not only on the outer circumferential side but also on a front side of the heat sink 130. In case of being mounted on the front side of the heat sink 130, the cooling fin 135 may be disposed in a plurality of positions.

Although the heat sink 130 and the cooling fin 135 are screw-connected in the above structure, the connection may be achieved by soldering or welding.

Exemplarily, the front side of the heat sink 130 is surface-mounted by pick-and-place and a rear side is reflow-soldered by a solder paste.

Figure 7:
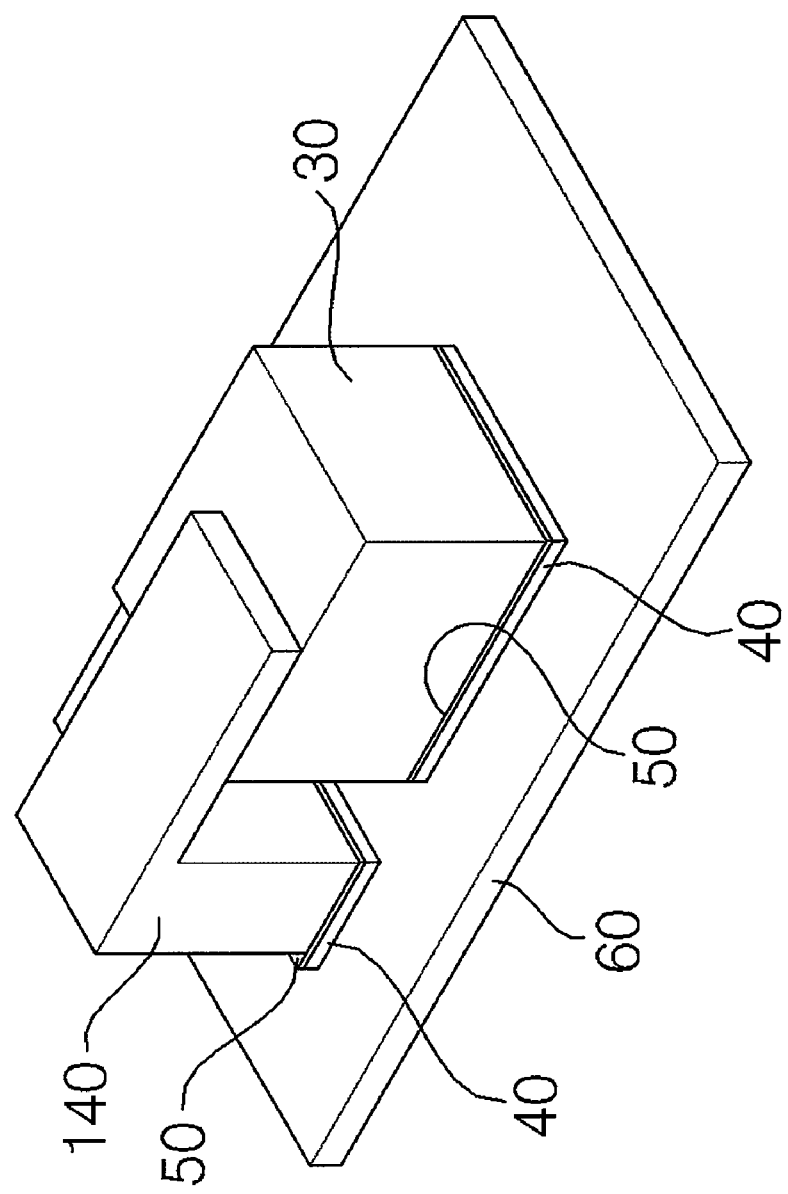
FIG. 7 is a view showing a heat sink according another embodiment of the present invention.

FIG. 7 is a view showing a heat sink 140 according another embodiment of the present invention.

As show in FIG. 7, the heat sink 140 has a bent part to be brought into direct contact with the heating element 30.

According to this structure, cooling of the heating element 30 may be more efficiently achieved by the direct contact between the heat sink 140 and the heating element 30.

However, in this case, the total height is increased.

Although not shown in FIG. 7, a thermal-conductive elastic member may be interposed at a contact part between the heating element 30 and the heat sink 140 to make elastic contact between them. The thermal-conductive elastic member may be disposed on either a rear side of the heat sink 140 or a front side of the heating element 30. According to this, since the contact is secured by the thermal-conductive elastic member, heat transfer from the heating element 30 to the heat sink 140 may be performed more effectively.

Exemplarily, a front side of the heat sink 140 is surface-mounted by pick-and-place and the rear side is reflow-soldered by a solder paste.

FIG. 8 shows a heat sink 150 according to another embodiment of the present invention.

Referring to FIG. 8, a sealed space 151 is formed in the heat sink 150, and a plurality of ribs 156 are arranged on an outer circumferential side of the heat sink 150. A wick 154, which is woven or knitted copper wire, or a plurality of grooves are formed along an inner side wall of the heat sink 150. The sealed space 151 is charged with a heat transfer medium 152 such as distilled water.

In other words, the heat sink 150 has the structure of a general heat pipe.

According to such a structure, the heat transfer medium 152 is condensed by a capillary pressure of the wick 154 formed on the inner side wall of the sealed space 151 or of the grooves, thereby being moved from a cooling part to a heating part. In addition, the heat transfer medium 152 which derived heat from the heating part expands and moves back to the cooling part through the wick 154. Here, the heat transfer efficiency is increased by the wick 154 or the grooves which maximize the surface area. The sealed space 151 may be under vacuum.

Exemplarily, a front side of the heat sink 150 is surface-mounted by pick-and-place and a rear side is reflow-soldered by a solder paste.

Although the present invention has been explained with reference to the exemplary embodiments, various modifications may be properly made by the skilled in the art.

For example, in the case where a heating element includes a lead frame, a heat sink may contact the lead frame. However, if the heating element is enclosed by a metal can for insulation of electromagnetic waves, the heat sink may contact the metal can.

In addition, the scope of the invention is also applied to a PCB including a heat sink mounted thereon to cool a heating element disposed adjacent thereto.

As described above, the heat sink according to the embodiments of the present invention have various advantages as follows.

1) Since a front side of the heat sink has at least one horizontal part, the heat sink may be conveniently surface-mounted by pick-and-place. In addition, a rear side of the heat sink is horizontal and therefore has a large contact area with the conductive pattern. Accordingly, the rear side may efficiently transfer heat of the heating element while achieving a high solder strength.

2) Since at least a part of the rear side of the heat sink is made of metal to which reflow soldering using a solder paste is applicable, the heat sink may be reflow-soldered using the solder paste.

3) A plurality of the heat sinks are arranged on the conductive pattern disposed adjacent to the heating element on a PCB. Therefore, heat of the heating element may be efficiently radiated and diffused.

4) When the heat sink is soldered to a ground pattern of the PCB, an electrical ground area is increased by the heat sink, thereby improving the radio frequency (RF) characteristics.

5) Various functions may be added by providing another thermally conductive material on an upper surface of the heat sink.

6) The form, material, and structure of the heat sink may be altered easily and economically so that various degrees of the heat radiation and diffusion efficiency are obtained.

7) The heat radiation and diffusion efficiency may be further improved by a via hole formed on the PCB.

8) The heat sink has a high thermal conductivity and a low weight, and is conveniently mounted at a low material cost 9) The heat sink is capable of cooling the heating element without increasing height of the heating element.

10) The heat sink is capable of further cooling a metal terminal especially susceptible to heat in comparison to a plurality of other metal terminals on the heating element.

While the present invention has been described in detail, it should be understood that various changes, substitutions and alterations can be made hereto without departing from the spirit and scope of the invention as defined by the appended claims.

What is claimed is:

1. A heat sink comprising a three-dimensional (3D) thermally conductive body which comprises a front side at least a part of which is horizontal,
    wherein the heat sink is configured to be picked up by applying a vacuum to the part of the front side and be surface-mounted on a conductive pattern of a printed circuit board (PCB) which a terminal of a heating element is mounted on,
    a rear side of the body is configured to be reflow-soldered to the conductive pattern, and heat generated from the heating element is radiated and diffused by being transferred to the terminal, the conductive pattern and the heat sink, and then to the air sequentially.

2. The heat sink of claim 1, wherein the body comprises any one of a metal, a thermally conductive ceramic material, and a carbon-containing material.

3. The heat sink of claim 1, wherein the rear side of body is horizontal.

4. The heat sink of claim 1, wherein the body comprises at least one uneven surface or rib formed on a lateral side thereof.

5. A heat sink comprising a three-dimensional (3D) thermally conductive body which comprises a front side at least a part of which is horizontal, wherein the heat sink is configured to be picked up by applying a vacuum to the part of the front side and be surface-mounted on a conductive pattern disposed adjacent to a heating element mounted on a printed circuit board (PCB), and a rear side of the body is configured to be reflow-soldered to the conductive pattern and the body comprises at least one recess or through hole.

6. The heat sink of claim 5, wherein an auxiliary cooling unit is removably mounted to the recess or the through hole, the auxiliary cooling unit comprising a cooling fin constituted by a metal shaft or pipe and a plurality of thin metal plates mounted to the shaft or pipe.

7. A heat sink comprising a three-dimensional (3D) thermally conductive body which comprises a front side at least a part of which is horizontal, wherein the heat sink is configured to be picked up by applying a vacuum to the part of the front side and be surface-mounted on a conductive pattern disposed adjacent to a heating element mounted on a printed circuit board (PCB), and a rear side of the body is configured to be reflow-soldered to the conductive pattern and the body comprises a sealed space charged with a heat transfer medium, and a wick is installed or a plurality of grooves are formed along an inner side wall of the sealed space.

8. The heat sink of claim 1, wherein the heat sink is provided in singular or in plural on the conductive pattern.

9. The heat sink of claim 1, wherein the conductive pattern comprises any one of a circuit pattern, a ground pattern, and a dummy pattern.

10. The heat sink of claim 1, wherein the conductive pattern is provided in singular or in plural on at least one of a front side and a rear side of the PCB.

11. The heat sink of claim 1, wherein the conductive pattern comprise a ground pattern disposed adjacent to the heating element mounted on the PCB, and an electrical ground area is substantially increased by the heat sink.

12. The heat sink of claim 1, wherein the conductive pattern disposed on one side of the PCB, on which the heating element is mounted, is connected with a conductive pattern disposed on the other side of the PCB through a via hole having a high thermal conductivity.

13. The heat sink of claim 1, wherein the PCB comprises any one of a polymer substrate, a film substrate, a ceramic substrate, and a metal substrate.

14. A heat sink comprising a three-dimensional (3D) thermally conductive body which comprises a front side at least a part of which is horizontal, wherein the heat sink is configured to be picked up by applying a vacuum to the part of the front side and be surface-mounted on a conductive pattern disposed adjacent to a heating element mounted on a printed circuit board (PCB), and a rear side of the body is configured to be reflow-soldered to the conductive pattern and, a thermally conductive material is disposed on a part of the body.

15. A heat sink comprising a three-dimensional (3D) thermally conductive body which comprises a front side at least a part of which is horizontal, wherein the heat sink is configured to be picked up by applying a vacuum to the part of the front side and be surface-mounted on a conductive pattern disposed adjacent to a heating element mounted on a printed circuit board (PCB), and a rear side of the body is configured to be reflow-soldered to the conductive pattern and a part of the body is brought into contact with the heating element.

16. A heat sink comprising a three-dimensional (3D) thermally conductive body which comprises a front side at least a part of which is horizontal, wherein the heat sink is configured to be picked up by applying a vacuum to the part of the front side and be surface-mounted on a conductive pattern disposed adjacent to a heating element mounted on a printed circuit board (PCB), and a rear side of the body is configured to be reflow-soldered to the conductive pattern and a part of the body is brought into contact with a metal can enclosing the heating element.

17. The heat sink of claim 12, wherein an inside of the via hole is charged with a thermally conductive material or a metal layer is formed on an inner wall of the via hole.

18. The heat sink of claim 12, wherein a heat sink is mounted the conductive pattern disposed on the other side of the PCB.

19. The heat sink of claim 1, wherein the heat sink has a smaller height than the heating element.

20. A PCB wherein the heat sink of claim 1 is reflow-soldered by a solder paste to the conductive pattern or a metal terminal disposed adjacent to the heating element to cool the heating element.

21. The heat sink of claim 1, wherein the heat sink is provided with tape-and-reel package.

* * * * *